(12) United States Patent
Hébert

(10) Patent No.: US 8,227,315 B2
(45) Date of Patent: Jul. 24, 2012

(54) INVERTED-TRENCH GROUNDED-SOURCE FET STRUCTURE USING CONDUCTIVE SUBSTRATES, WITH HIGHLY DOPED SUBSTRATES

(75) Inventor: François Hébert, San Mateo, CA (US)

(73) Assignee: Alpha & Omega Semiconductor, Incorporated, Sunnyvale, CA (US)

( * ) Notice: Subject to any disclaimer, the term of this patent is extended or adjusted under 35 U.S.C. 154(b) by 0 days.

(21) Appl. No.: 13/200,867

(22) Filed: Oct. 4, 2011

(65) Prior Publication Data

US 2012/0028426 A1    Feb. 2, 2012

Related U.S. Application Data

(62) Division of application No. 12/653,354, filed on Dec. 11, 2009, now Pat. No. 8,053,834, and a division of application No. 11/500,810, filed on Aug. 8, 2006, now Pat. No. 7,633,120.

(51) Int. Cl.
*H01L 21/336* (2006.01)

(52) U.S. Cl. ........ 438/270; 438/589; 257/330; 257/331; 257/332; 257/341; 257/E29.257; 257/E29.26; 257/E21.41

(58) Field of Classification Search .................. 438/270, 438/589; 257/330, 331, 332, 341, E29.257, 257/E29.26, E21.41
See application file for complete search history.

(56) References Cited

U.S. PATENT DOCUMENTS

| | | | |
|---|---|---|---|
| 2003/0168713 A1* | 9/2003 | Narazaki et al. | 257/513 |
| 2006/0113589 A1* | 6/2006 | Jones | 257/330 |
| 2007/0004134 A1* | 1/2007 | Vora | 438/257 |

* cited by examiner

*Primary Examiner* — Tu-Tu Ho
(74) *Attorney, Agent, or Firm* — Bo-In Lin

(57) ABSTRACT

This invention discloses an inverted field-effect-transistor (iT-FET) semiconductor device that includes a source disposed on a bottom and a drain disposed on a top of a semiconductor substrate. The semiconductor power device further comprises a trench-sidewall gate placed on sidewalls at a lower portion of a vertical trench surrounded by a body region encompassing a source region with a low resistivity body-source structure connected to a bottom source electrode and a drain link region disposed on top of said body regions thus constituting a drift region. The drift region is operated with a floating potential said iT-FET device achieving a self-termination.

14 Claims, 14 Drawing Sheets

INVERTED-TRENCH GROUNDED-SOURCE FET STRUCTURE USING CONDUCTIVE SUBSTRATES, WITH HIGHLY DOPED SUBSTRATES

This Patent Application is a Divisional Application and claims the Priority Date of application Ser. No. 12/653,354 filed on Dec. 11, 2009, now U.S. Pat. No. 8,053,834 and application Ser. No. 12/653,354 is a Divisional Application of application Ser. No. 11/500,810 filed on Aug. 8, 2006 by common Inventors of this Application. The application Ser. No. 11/500,810 is now issued into U.S. Pat. No. 7,633,120. The Disclosures made in the patent application Ser. Nos. 12/653,354 and 11/500,810 are hereby incorporated by reference.

BACKGROUND OF THE INVENTION

1. Field of the Invention

The invention relates generally to the semiconductor power devices. More particularly, this invention relates to an inverted-trench grounded source field effect transistor (FET) structure that uses a conductive substrate with highly doped P+ substrate.

2. Description of the Prior Art

Conventional technologies to further reduce the source inductance for semiconductor power devices including the source inductance in FET, MOSFET and JFET devices are challenged by several technical difficulties and limitations. Specifically, there are technical challenges faced by those of ordinary skill in the art to reduce the source inductance. Meanwhile, there are ever increasing demand to reduce the source inductance in the semiconductor power devices because more and more power devices are required for applications that demand these devices to function with high efficiency, high gain, and high frequency. Generally, reduction of source inductance can be achieved by eliminating the bond-wires in the package of a semiconductor power device. Many attempts are made to eliminate the bond-wires by configuring the semiconductor substrate as a source electrode for connection of the semiconductor power devices. There are difficulties in such approaches due to the facts that typical vertical semiconductor power devices is arranged to place the drain electrode on the substrate. Referring to FIGS. 1A and 1B for the vertical power devices shown as trenched and planar DMOS devices respectively that uses the substrate as the drain electrode with the current flows vertically from the source down to the drain region disposed at the bottom of the substrate. The top source electrode usually requires bond wires for electrical connections during a device packaging process thus increasing the source inductance.

Other packaging technologies such as flip chip packaging can be applied in some instances. However, when applying a flip chip configuration to a vertical DMOS with the drain contact brought to the top surface. The drain contact and the gate pad are both disposed on the top surface and that results in drawbacks due the large dies that leads to increased processing cost and complexity. Furthermore, there are extra processing costs for the formation of solder balls or solder pillars on the top side of the device, particularly for CMOS or LDMOS style planar devices.

Referring to FIG. 1C for a new vertical channel LDMOS device disclosed by Seung-Chul Lee et al, in Physica Cripta T101, pp. 58-60, 2002, with a structure shown as a standard vertical trenched DMOS wherein the drain contact is disposed on the side while the source is still on top of the active area. However, this device has a limitation due to a large cell pitch caused by the lateral spacing required by the top drain contact. In addition to the limitation of large cell pitch, the trenched FET device in general has a fabrication cost issue due to the fact that the trenched FET requires technologies that may not be available in all foundries and that tend to drive up the fabrication costs. For this reason, it is also desirable to implement the power device as lateral device with planar gate.

Several lateral DMOS with grounded substrate source have been disclosed. A lateral DMOS device typically includes a P+ sinker region (or alternate a trench) to connect the top source to the P+ substrate. The sinker region or the trench increases the pitch of the cell due to the dimensions occupied by the sinker or the trench. Referring to FIG. 1D for a device cross section disclosed by G.Cao et.al, in "Comparative Study of Drift Region. Designs in RF LDMOSFETs", IEEE Electron Devices, August 2004, pp 1296-1303.Ishiwaka O et al; disclose in "A 2.45 GHz power Ld-MOFSET with reduced source inductance by V-groove connections", International Electron Devices Meeting. Technical Digest, Washington, DC, USA, 1-4 Dec. 1985,pp. 166-169. In U.S. Pat. No. 6,372, 557 by Leong (Apr. 16, 2002) attempts are made to use a buried layer at the interface of the P+ and P-epi layers to reduce the lateral diffusion and hence reduce pitch. In U.S. Pat. No. 5,821,144 (D'Anna and Hébert, Oct 13, 1998) and U.S. Pat. No. 5,869,875, Hébert "Lateral Diffused MOS transistor with trench source contact" (issued on Feb.9, 1999) devices are disclosed to reduce the cell pitch by placing the source sinker or trench on the OUTER periphery of the structure. However, in these disclosures, most of the devices as shown use the same metal over the source/body contact regions and gate shield regions and some of the devices use a second metal for drain and gate shield regions. These configurations generally has large cell pitch due to the lateral diffusions that increases the drift length over the horizontal plane. A large cell pitch causes a large on-resistance that is a function of resistance and device areas. A large cell pitch also increases the device costs due to a larger size of the device and a larger size package.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved inverted ground-source trenched FET on highly doped substrate, e.g., highly doped P+ substrate, with a bottom-source and top-drain having a reduced cell pitch thus achieving low manufacturing cost. The low manufacturing cost is achieved because a low effective die cost with a reduce cell pitch when the improved device configuration is implemented. The above discussed technical difficulties and limitations of not able to shrink the cell pitch as encountered in the conventional semiconductor power devices are therefore overcome.

Specifically, it is an aspect of the present invention to provide a new and improved inverted ground-source trenched FET on highly doped substrate, e.g., highly doped P+ substrate, with a bottom-source and top-drain that has a significant reduce source inductance by eliminating the source wires and meanwhile minimizing the specific on resistance Rsp by using an integrated body-source short structure at the lower portion of the trenches surrounded by the gate electrodes.

It is another aspect of the present invention to provide a new and improved inverted ground-source trenched FET on highly doped substrate, e.g., highly doped P+ substrate, with a bottom-source and top-drain that are scalable for compatible with applications over a range of high and low voltages. The semiconductor power devices as disclosed in this invention further achieve rugged and reliable performance with reduced possibility of latch up, reduced hot carrier injection and peak voltage generation away from gate oxide, etc. because of the distributed body contact configurations.

It is another aspect of the present invention to provide a new and improved inverted ground-source trenched FET on highly doped substrate, e.g., highly doped P+ substrate, with a bottom-source and top-drain that are scalable for providing a vertical current channel with controllable drift region length such that it is more adaptable for pitch reduction configurations. The bottom source connection is established through a conductive substrate and a source contact formed at the bottom of the trench in direct contact with the highly doped substrate. The requirement for using a deep resistive sinker or a trench contact is therefore eliminated.

It is another aspect of the present invention to provide a new and improved inverted ground-source trenched FET on highly doped substrate, e.g., highly doped P+ substrate, with a bottom-source and top-drain with reduced gate-drain capacitance by forming a thicker oxide layer over the drain extension to reduce the drain-to-gate capacitance Cgd to increase the break down voltage (BV).

It is another aspect of the present invention to provide a new and improved inverted ground-source trenched FET on highly doped substrate, e.g., highly doped P+ substrate, with a bottom-source and top-drain with the termination region formed outside the continuous gate ring structure. In a preferred embodiment, a typical layout of this structure is based on a closed cell configuration. The N-drift region in this configuration is left unconnected because there is no contact to the termination region. Since the substrate is at the source potential that is ground potential for an NMOS device, the floating N-drift region is likely operates at a ground potential to provide a self-termination. The device configuration further has an advantage that any damage from the sawing of the dies in the scribing region will tend to short the floating N-drift regions to the grounded substrate.

Briefly in a preferred embodiment this invention discloses a semiconductor power device constituting an inverted ground-source trenched FET on highly doped P+ substrate with a bottom-source and top-drain that further includes a plurality of trenches for forming a gate therein. The semiconductor power device further includes a body-source contact disposed on the bottom of the trenches isolated from the trenched gate for electrically connecting a body region to a source region on the highly doped P+ substrate.

Furthermore, this invention discloses a method for manufacturing an iT-FET semiconductor device. The method includes a step of forming a source on a bottom and a drain on a top surface of a semiconductor and forming a trenched gate as a gate layer attached to trench sidewalls for controlling a vertical channel along the trenched gate in the semiconductor substrate. The method further includes a step of forming the trenched gate to fully surround the source and drain all sides whereby the iT-FET device achieving a self-termination.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
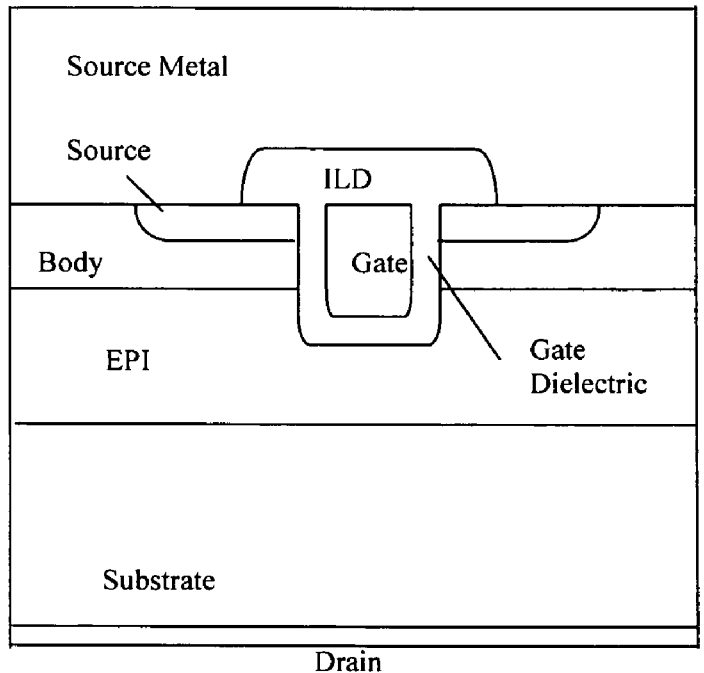
FIGS. 1A and 1B are cross sectional views for showing the typical vertical power device configurations implemented as a trenched-gate and planar-gate vertical power devices respectively.
Figure 1B:
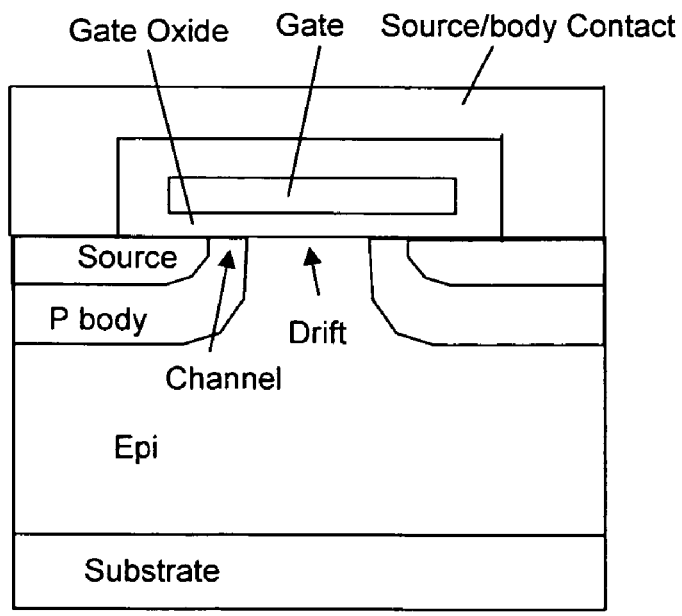
Figure 1C:
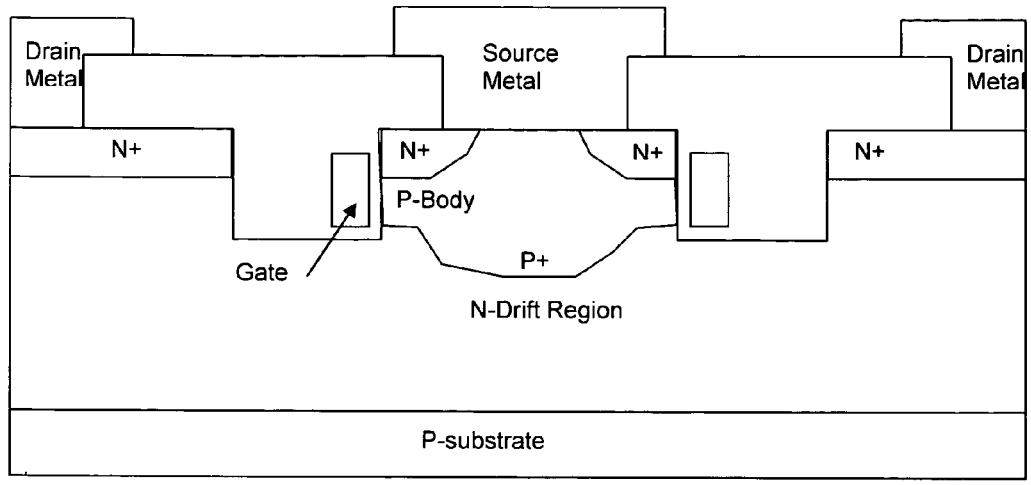
FIG. 1C is a cross sectional view of vertical channel LDMOS device.
Figure 1D:
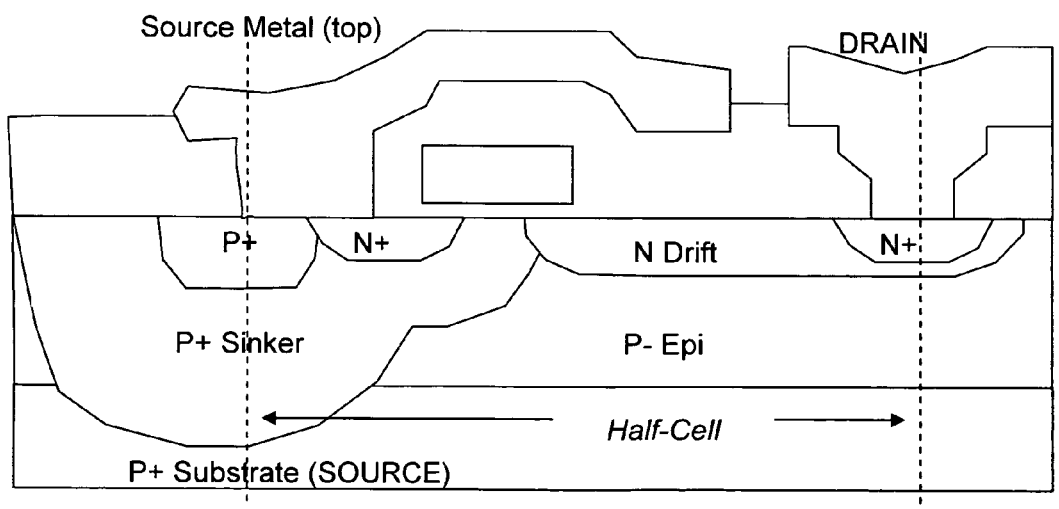
FIG. 1D is a cross sectional view of a drift region design in a LDMOSFET device for RF application.
Figure 2:
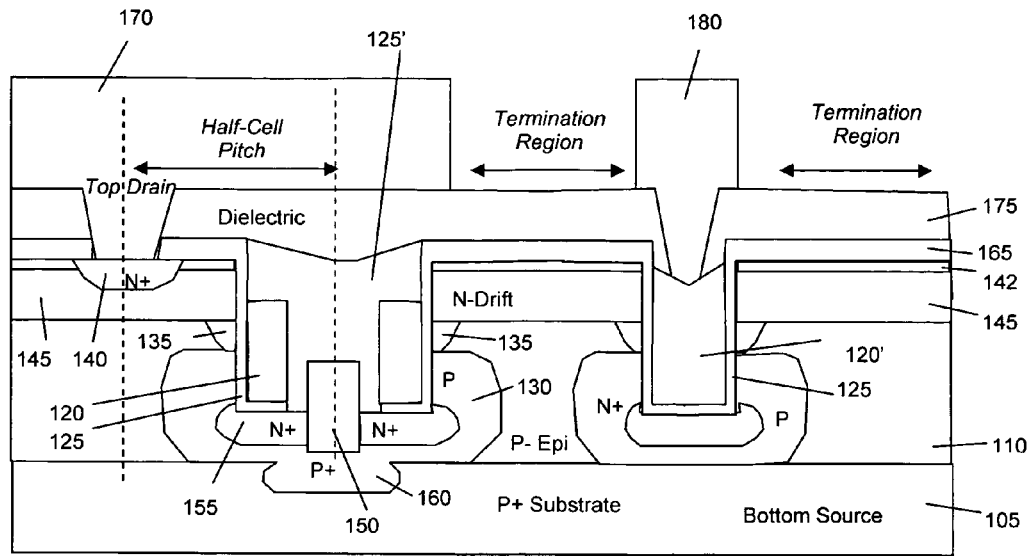
FIG. 2 is a cross sectional view of an inverted ground-source trenched FET device with body-source short structure formed on the bottom of a trench distributed within the device as an embodiment of this invention.

Referring to FIG. 2 for a cross sectional view of an N-channel inverted ground-source trenched FET device with a bottom source and a top drain of this invention. The inverted ground-source trenched N-channel FET device is supported on a P+ substrate 105 functioning as a bottom source electrode. Alternatively a P-channel device may be formed over an N+ Si substrate or other substrate such as silicon carbide, GaN, or other kinds of semiconductor substrates, etc. A layer of P− epitaxial layer 110 is supported on top of the substrate 105. The substrate is configured with an active cell area and a termination area typically disposed on the peripheral of the substrate. The FET device 100 has a plurality of trenches opened from the top surface of the substrate to reach to a lower portion of the epitaxial layer 110. The trenches opened in the active cell area is wider to form a gate with gate polysilicon layer attached to the sidewalls of the trench with the sidewalls of the trenches padded with a trench wall oxide layer 125 and the central portion filled with an insulation material, e.g., a BPSG layer 125'. A trench of a narrower width is formed in both the termination area or within the active area to form the gate runner 120' with trenched sidewall gate 120 from the active area to the termination area. A P-body region 130 is formed in the epitaxial layer surrounding the insulated trenched sidewall gate 120. An N-link region 135 is formed on top of the body region 130 to contact a N-drift region 145 encompassed a N+ drain contact region 140 near the top surface of the substrate. A surface blanket N type implant layer 142 is optional.

The trenched vertical FET device further includes a body-source short structure formed at the bottom of the trenches in the active cell area. The body-source short structure is formed with a conductive plug 150, e.g., a silicide of Ti, Co, W plug, surrounded by a highly doped N+ region 155 and a highly doped P++ region 160 below the conductive plug 150 to form a highly conductive low resistivity body-source short structure. A drain metal covers 170 the active cell area and a gate metal 180 is formed in the termination area. The drain metal and the gate metal are in electrical contact with the drain 140 and the gate runner 120' through a drain contact opening and gate contact opening opened through the dielectric layer 175, e.g., a BPSG layer, and an insulation layer, e.g., an oxide layer 165, covering the top surface of the FET device. The integrated body/source short 150 as shown is distributed throughout the device. The device structure provides a vertical channel that includes a bottom source with the source connected to the bottom of the substrate. Unlike the conventional bottom source devices, the bottom source devices of this invention are implemented without using a P+ sinker immediately below the source region. Instead, the bottom source device of this invention employs an embedded source and body with the source/source short structure 150. Therefore, the device structure of this invention saves the lateral space and avoids the lateral diffusion for the P+ sinker.

Figure 3:
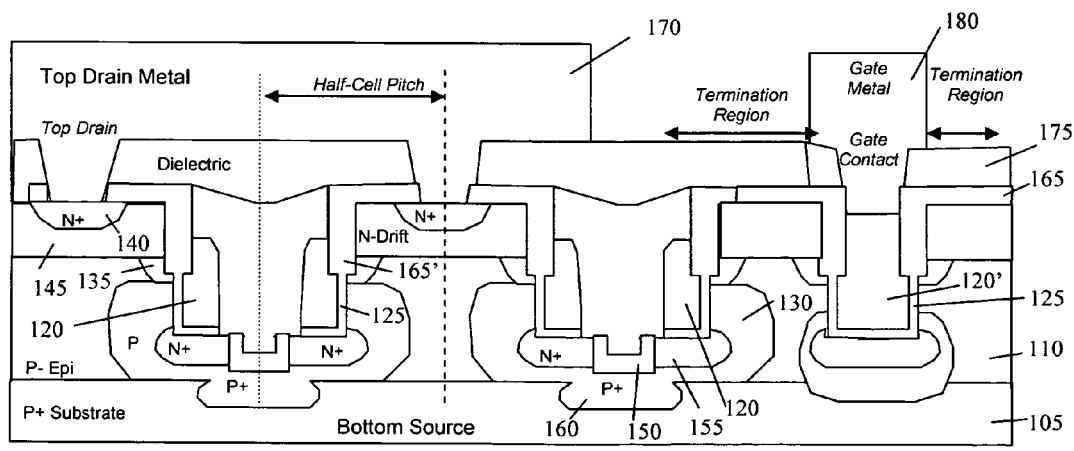
FIG. 3 is a cross sectional view of another inverted ground-source trenched FET device with body-source short structure formed on the bottom of a trench distributed within the device as and a thicker oxide over the drain extension to reduce the Cgd and increase BV as another embodiment of this invention.

Referring to FIG. 3 for an alternate embodiment of an inverted ground-source trenched FET device that has a similar configuration as that shown in FIG. 2. A thicker oxide layer 165' formed over the drain extension to reduce the drain-to-gate capacitance Cgd to increase the break down voltage (BV). The gate contact region in the termination area is shown with a thicker oxide layer 165'. The trench is narrower and filled with the gate polysilicon layer 120'. The gate metal 180 is formed the same time as the drain metal 170 is formed then patterned into the drain metal and the gate metal on the top surface of the device with the source electrode formed at the bottom of the substrate serving as a ground electrode.

A typical layout of this structure is based on a closed cell configuration. The N-drift region OUTSIDE of the active cell in this configuration is left unconnected because there is no contact to the termination region. Since the substrate is at the source potential that is ground potential for an NMOS device, the floating N-drift region 145 is likely operates at a ground potential. The device configuration as shown further has an advantage that any damage from the sawing of the dies in the scribing region will tend to short the floating N-drift regions to the grounded substrate. The structure is therefore self-terminated, eliminating the need for complex termination schemes such as floating rings, junction-termination-extensions, field plates, etc, that are typically required for prior-art vertical planar and Trench-MOSFET structures.

Figure 4:
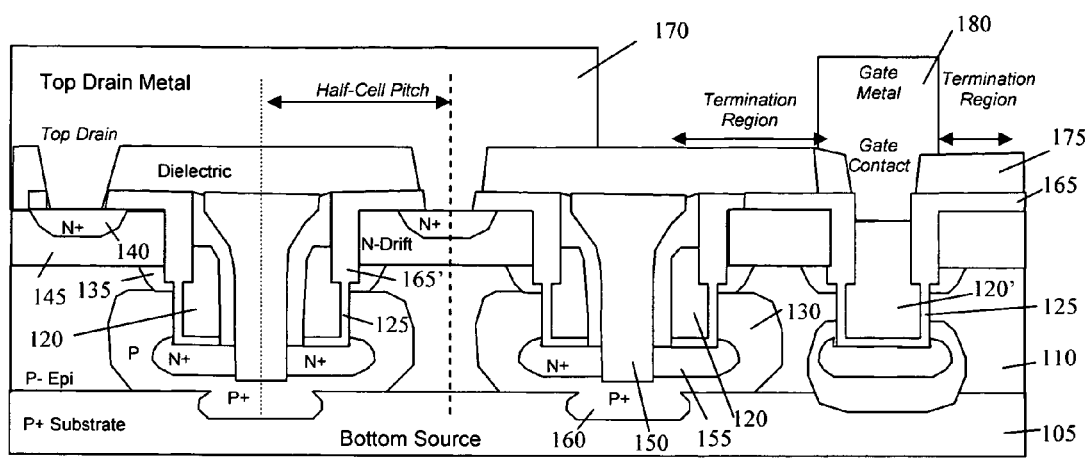
FIG. 4 is a cross sectional view of another inverted ground-source trenched FET device with body-source short structure formed as an integrated gate shield to reduce the parasitic capacitance as another embodiment of this invention.

Referring to FIG. 4 for an alternate embodiment of an inverted ground-source trenched FET device that has a similar configuration as that shown in FIG. 3. The only difference is the body-source short structure is now formed as an integrated gate shield 150' that extended from the top of the substrate into the bottom source layer 105 to contact the highly doped P++ regions 160. This integrated gate shield to function as the source-body short structure further reduces the parasitic capacitance.

Figure 5A:
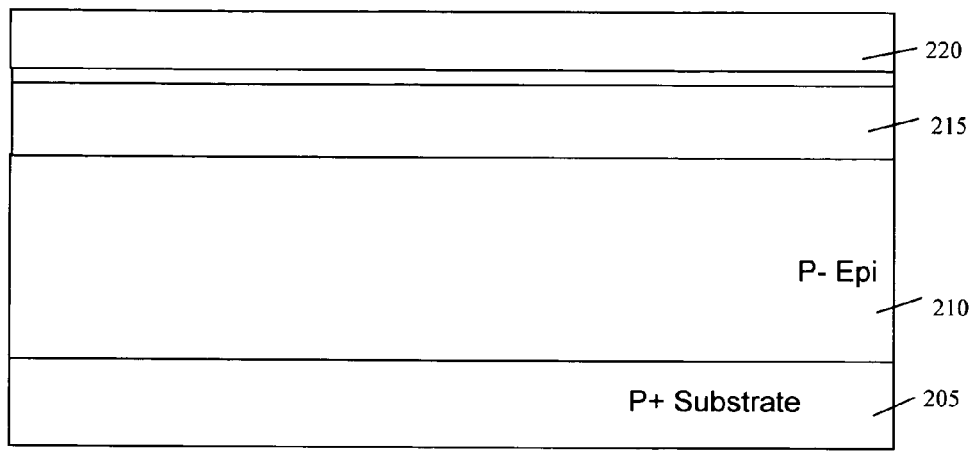
FIGS. 5A to 5T are a series of cross sectional views to illustrate the manufacturing processes implemented in this invention to manufacture a device as shown in FIG. 2.
Figure 5B:
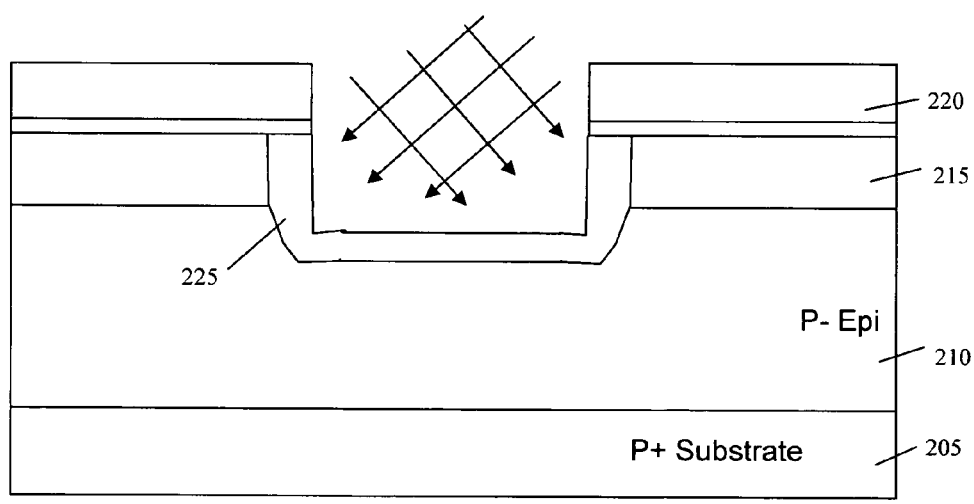
Figure 5C:
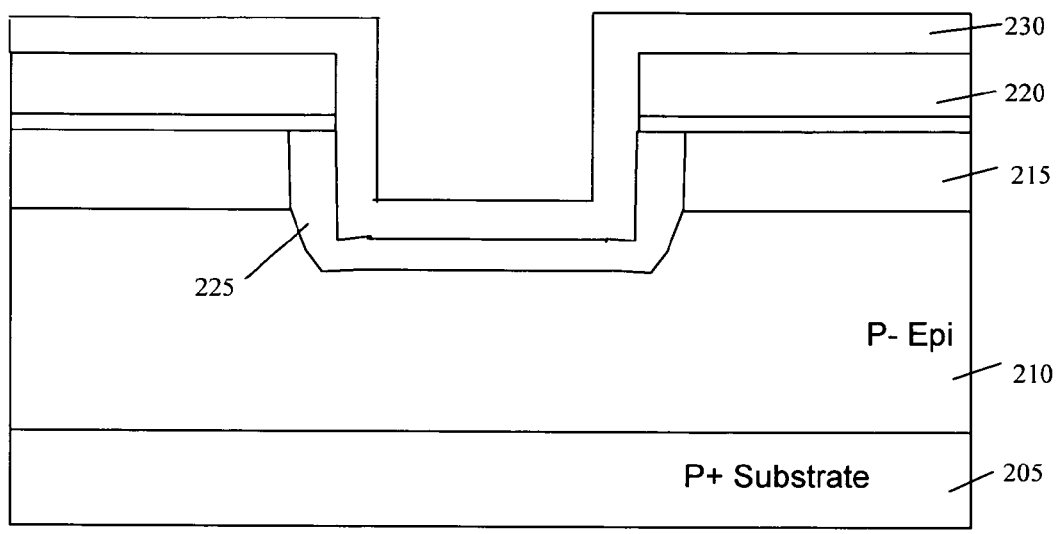
Figure 5D:
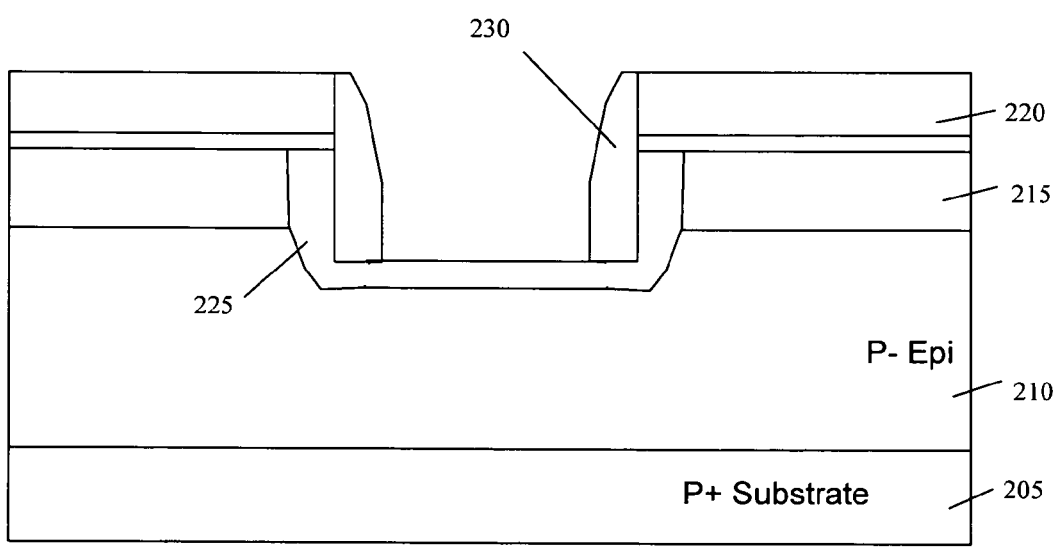
Figure 5E:
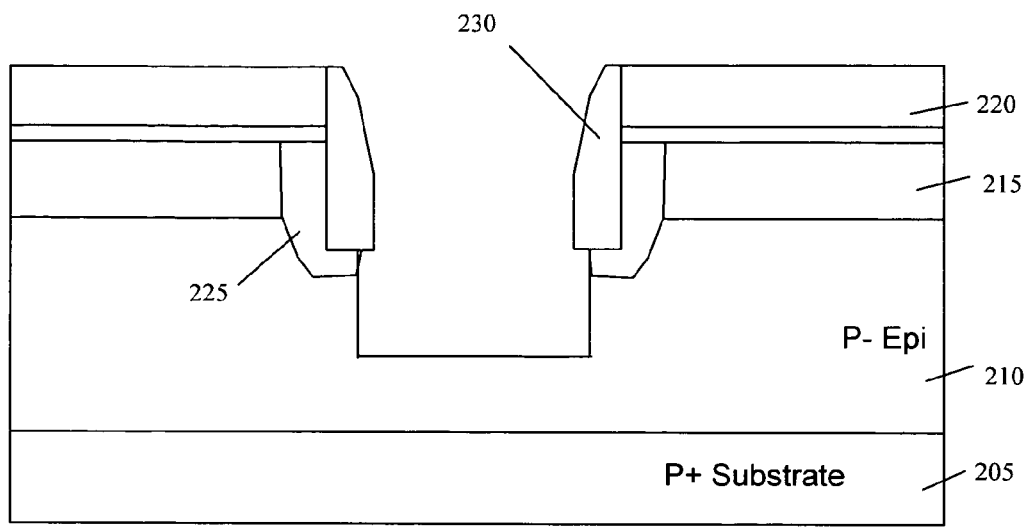
Figure 5F:
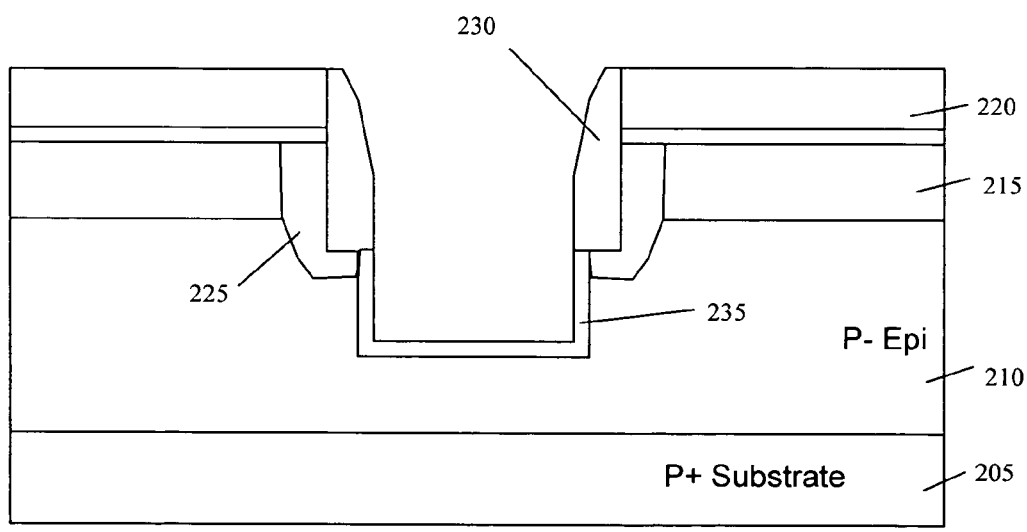
Figure 5G:
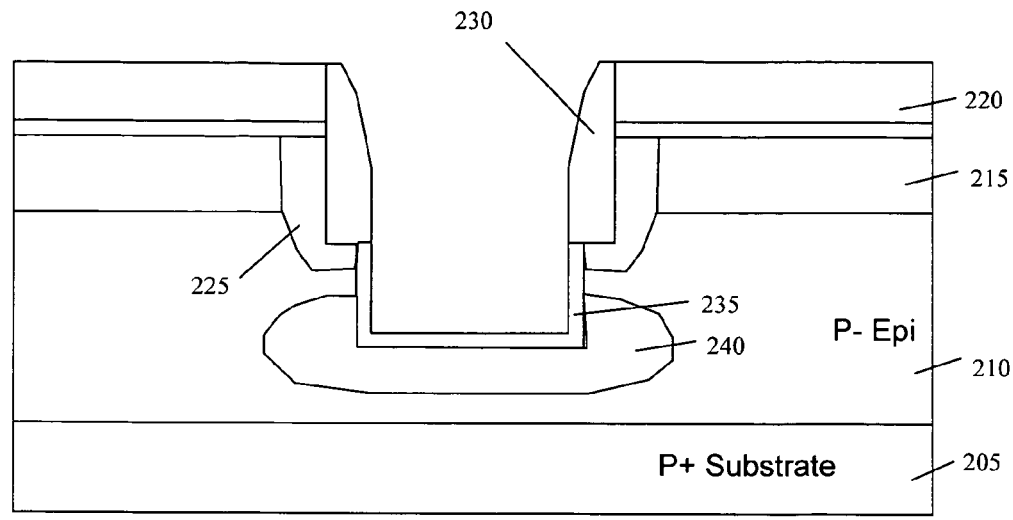

The body-source short structure 150 as shown in FIGS. 2-4 is formed in each active cell to connect the source region 155 to the bottom source electrode disposed on the bottom of P+ substrates. Alternatively an N-channel device may be formed over an N+ substrate and such device does not need to have the body-source short in every cell, all over the active area, since the source will automatically connect to the N+ substrate Referring to FIGS. 5A to 5T for series of cross sectional views to illustrate the manufacturing processes for making a device structure as shown in FIG. 3. As will be understood from the disclosures made in through the descriptions of the manufacturing steps, the processes only require three masking steps because of a beneficial Self-Aligned Structure. The processes start with a silicon substrate that has a highly P+ doped bottom 205 to function as a source terminal. The P+ doped bottom layer 205 may be doped with Boron to have a resistivity of 3 to 5 mOhm-cm or a lower resistivity. A P− epitaxial layer 210 supported on the substrate 205 with a thickness ranging from 2 to 7 micrometers. In one embodiment, the P-type epitaxial layer is doped with a low dosage of 5E14 to 5E15 for 20-60 volts application. In another embodiment, the epitaxial layer 210 may be an N− doped layer. Optionally, a blanket shallow N-type implantation is performed to form an N-drift region 215 followed by a thick oxide deposition to form an oxide layer 220 as a hard mask with a thickness ranging from 0.5 µm to 1.5 µm. A densification process by applying an elevated temperature is carried out as an optional step. In FIG. 5B, a first mask, i.e., a trench mask (not shown), is applied to carry out a hard mask etch followed by a silicon etch up to 70% to 130% depth of the N-well or N-epitaxial layer thickness. The process may follow with an isotropic etch and these etch processes open a trench through the hard mask layer 220, the drift region to extend the trench into the epitaxial layer 210. The a N-link region implant is carried out by implanting phosphorous ions at quad tilt or double ±7 degree tilt angles with a dosage ranging between 1E12 to 1E13 to form the N-link regions 225 surrounding the trench sidewalls and the trench bottom. Other angles of ion implantations ranging from 4 degrees to 15 degrees or more may be used as well, depending on the dimensions and geometry of the structure. In FIG. 5C, a conformal oxide deposition of an oxide layer 230 is deposited followed by an anisotropic etch as shown in F*ig*.5D to remove the top of the conformal oxide layer while leaving a thick sidewall oxide layer 230 covering the trench sidewalls. In FIG. 5E, a selective silicon channel etch is performed to etch a depth of 0.3 to 1.0 µm from the trench bottom into the epitaxial layer followed by carrying out an isotropic silicon etch to further extend the trench by a depth of 0.3 to 1.0 µm as an optional step. In FIG. 5F, a sacrificial etch is first performed followed by a thermal oxide growth process to form a gate oxide layer 235 covering the lower portion of the trench sidewalls. In FIG. 5G, a zero tilt boron channel implant is carried out through the trenches with an implant dosage ranging between 5E12 to 1E14 to form a trench bottom body region 240 forming a channel along the sidewalls of the trenches. Then an elevated temperature of approximately 1050 C is applied with a nitrogen gas N2 for about thirty minutes to drive the trench bottom body region 240 forming a channel along the sidewalls of the trenches.

Figure 5H:
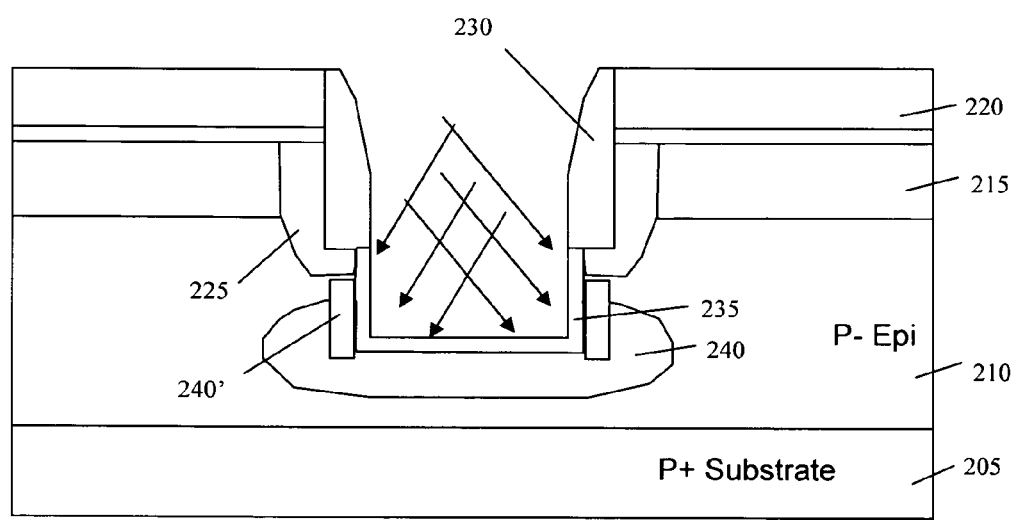
Figure 5I:
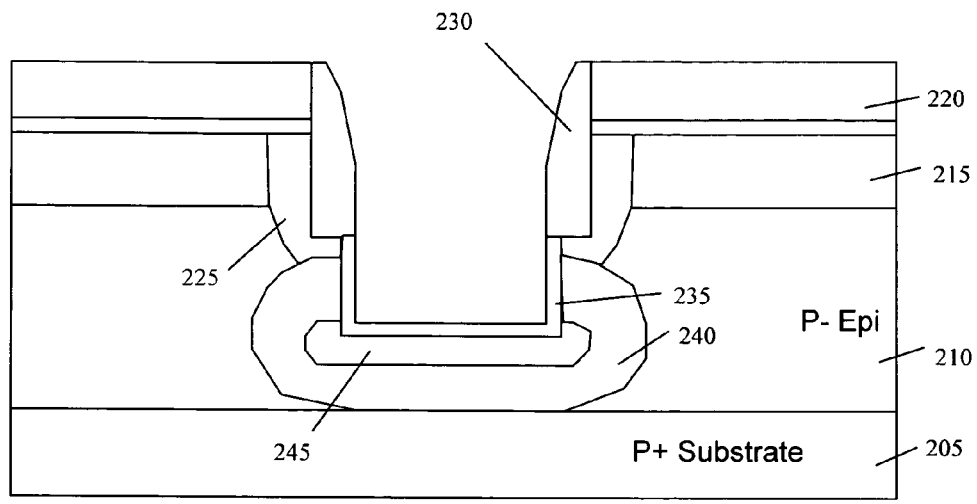
Figure 5J:
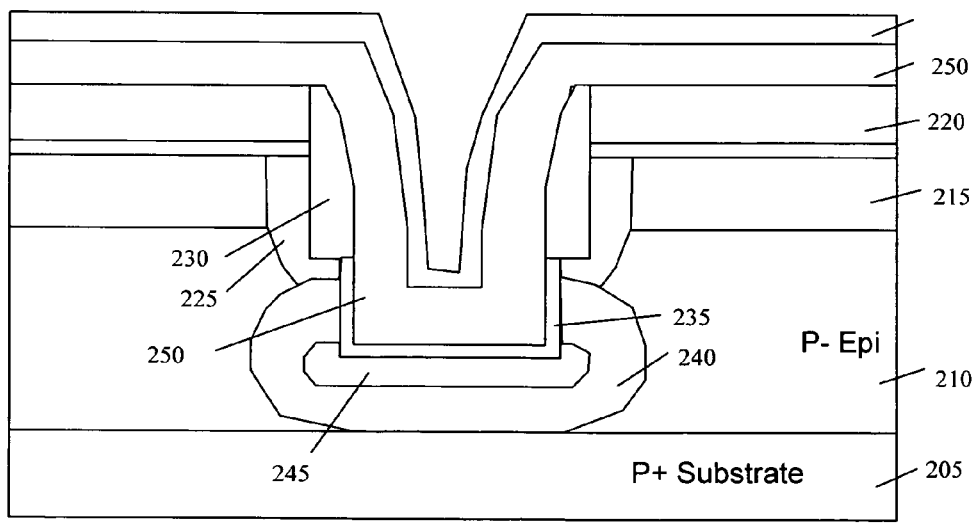
Figure 5K:
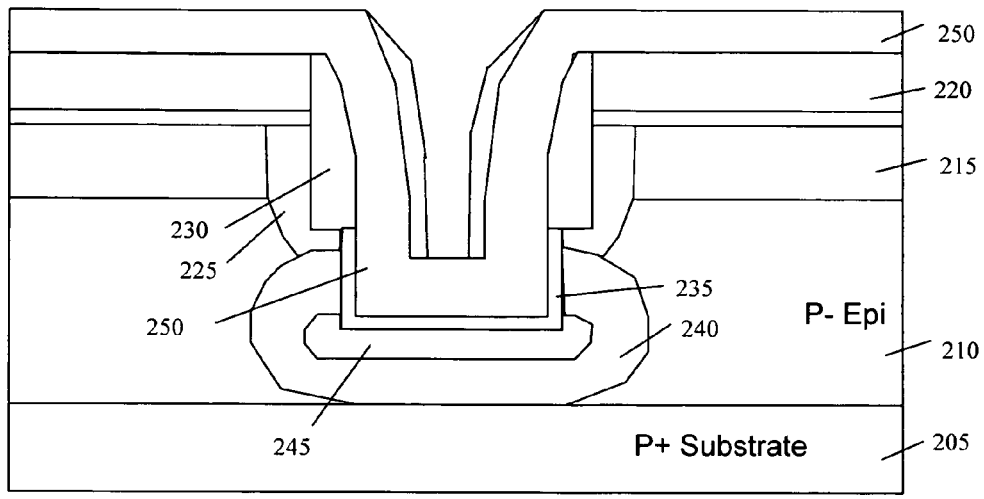
Figure 5L:
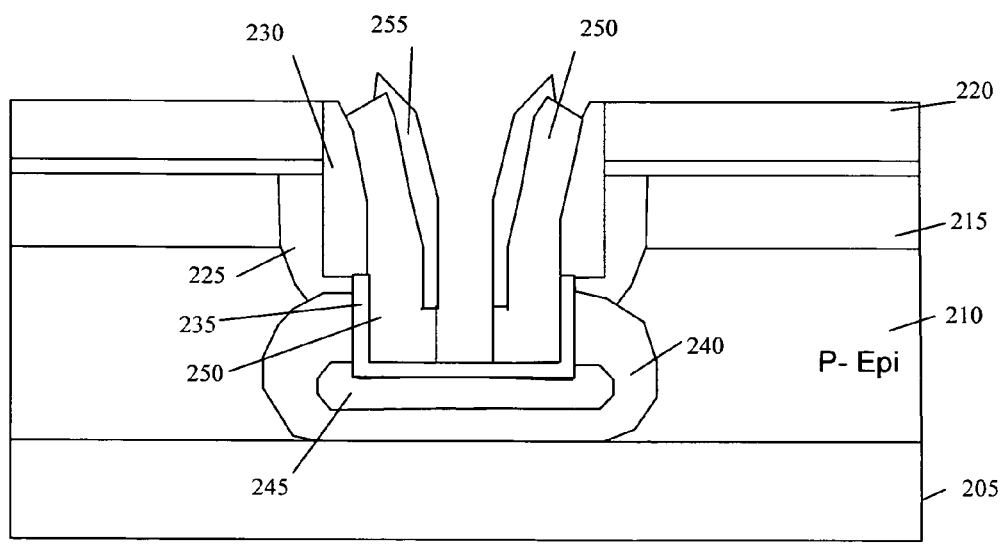
Figure 5M:
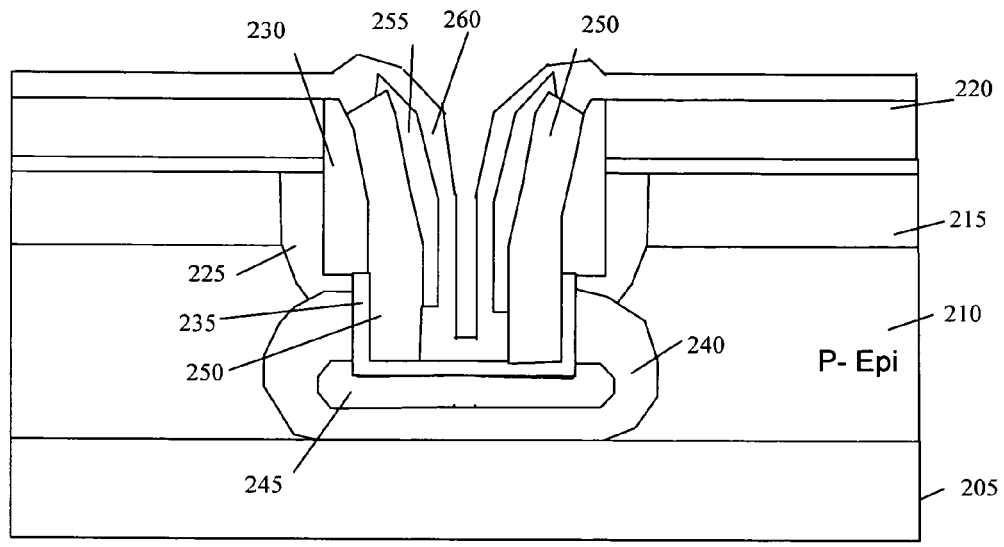
Figure 5N:
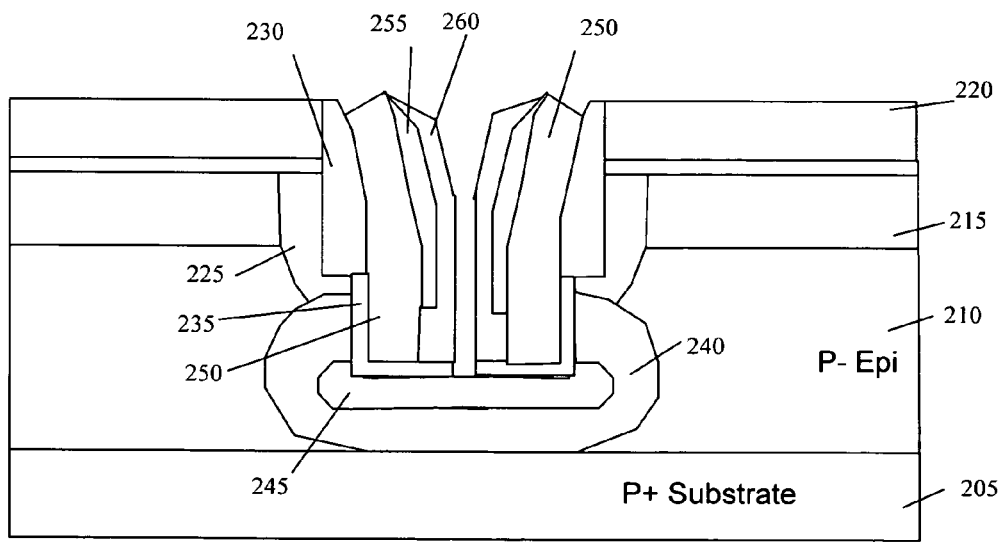

In FIG. 5H, a tilt lower dose boron implant through the bottom portions of the trench sidewalls is performed to complete the channel implant for threshold and punch through adjustments. The thick oxide layer 230 on the drain sidewalls functions as a mask for this channel implant. In FIG. 5I, an anneal operation is performed with nitrogen gas N2 at an elevated temperature ranging from 950 to 1100° C., followed by a source implant with arsenic ions at a dosage ranging between 1 to 6E15 with an implanting energy of 40 to 160 Kev with zero tilt implant angle is performed through the trenches to form the trench bottom source regions 245. Then a source anneal operation is performed as an optional processing step. In FIG. 5J, a sacrificial oxide strip is performed to remove the oxide layer followed by a gate oxide growth then a polysilicon layer 250 is deposited followed by an in-situ implant to doped the polysilicon layer 250. Then an oxide layer 255 is deposited on top of the polysilicon layer. In FIG. 5K, an anisotropic oxide etch is performed to remove the oxide layer 255 from the top of the polysilicon layer 250 leaving only the oxide layer 255 covering the polysilicon layer 250 in the trenches. In FIG. 5L a polysilicon anisotropic etch is carried out to remove the polysilicon layer 250 outside of the trenches and leaving only the polysilicon layer 250 to function as sidewall gates inside the trenches attached to the trench sidewalls covered by the oxide layer 255. In FIG. 5M, an optional isotropic silicon etch is performed to pull back the polysilicon in the trench bottom slightly under the trench spacer layer 255 followed by a conformal oxide layer 260 with a thickness ranging between 500 to 2000 Angstroms is deposited for covering the top surface of the device. Then a polysilicon oxidation anneal at an temperature ranging from 850° C. to 1050° C. is carried out to grow an oxide layer of thickness ranging from 50 to 600 Angstroms followed by an oxide densification process. In FIG. 5N, an anisotropic oxide etch is performed to remove the oxide layer 260 from outside of the trenches and the oxide layer 260 that covers the bottom of the trenches to expose the contact to the body regions 240 encompassing the source region 245 and forming a channel along the sidewalls of the trenches. The anisotropic etch is controlled as a time etch without over etching the oxide layer thus leaving the oxide layer 260 in the field regions covering the bottom portions of the polysilicon gates 250.

Figure 5O:
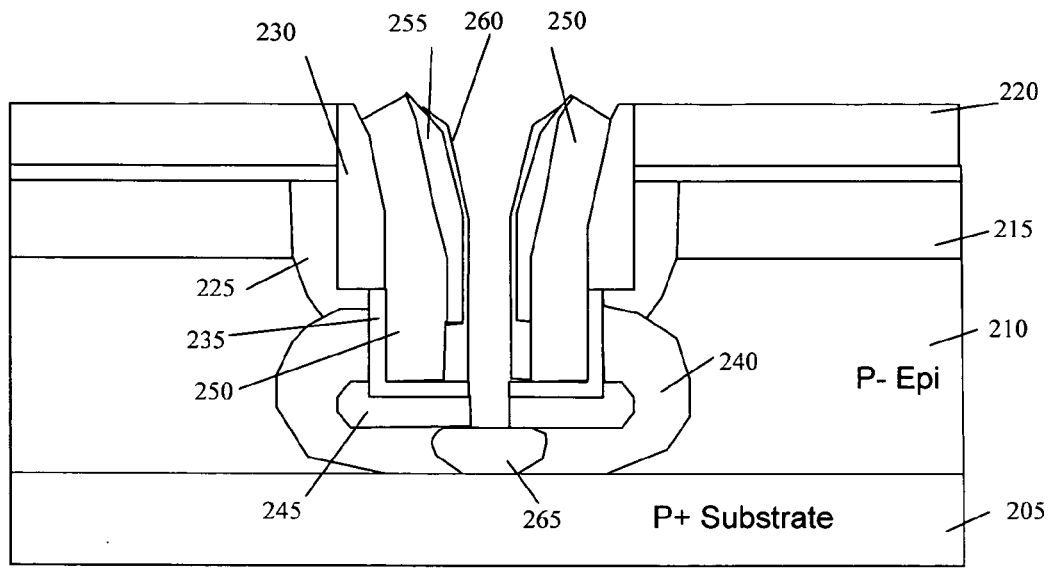
Figure 5P:
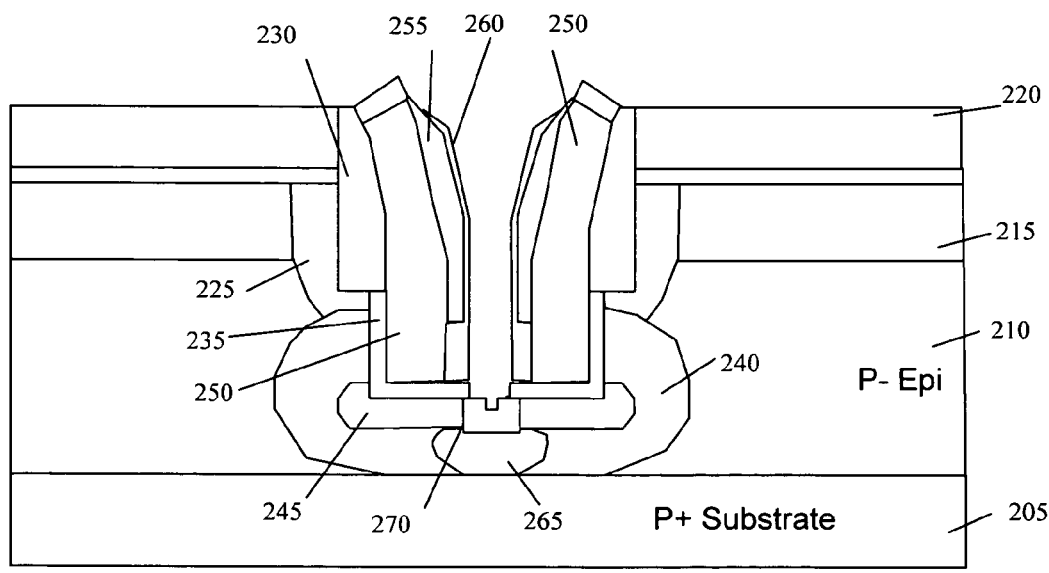
Figure 5Q:
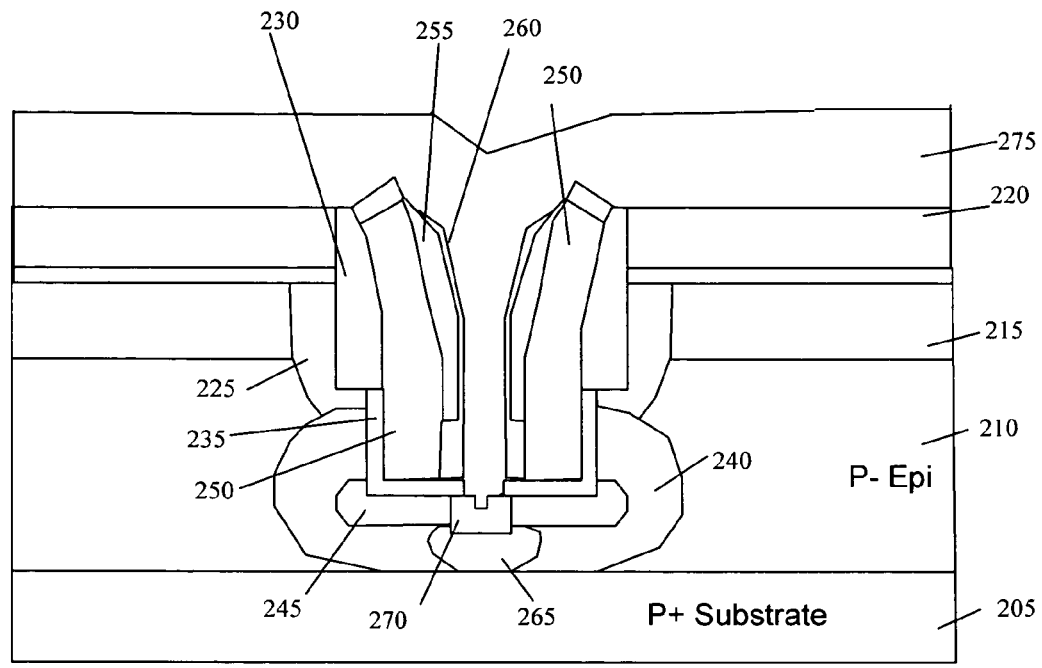
Figure 5R:
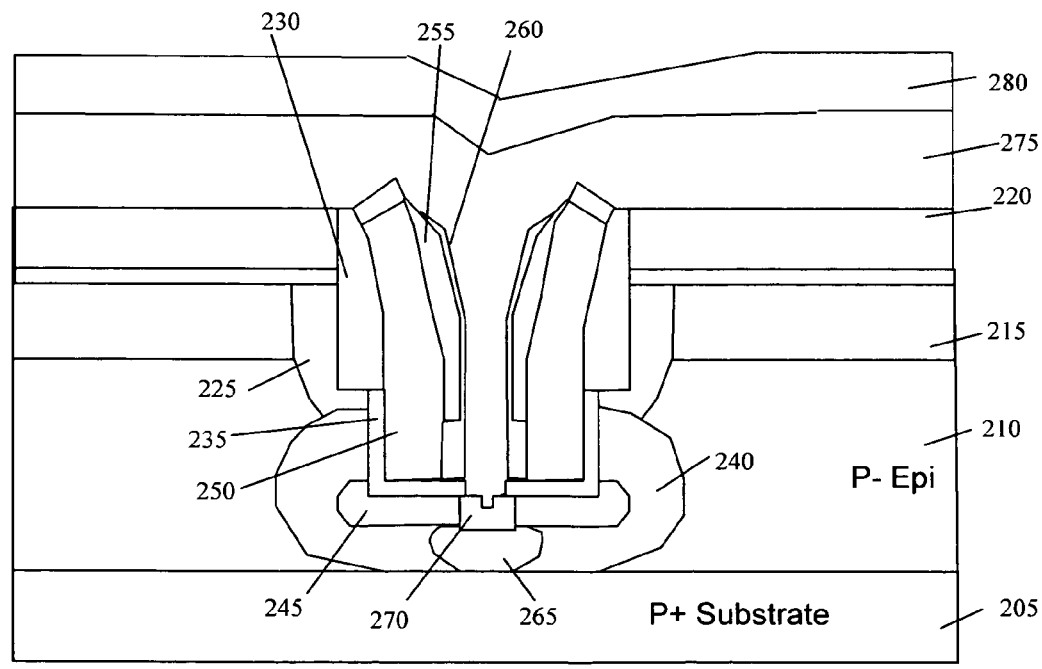
Figure 5S:
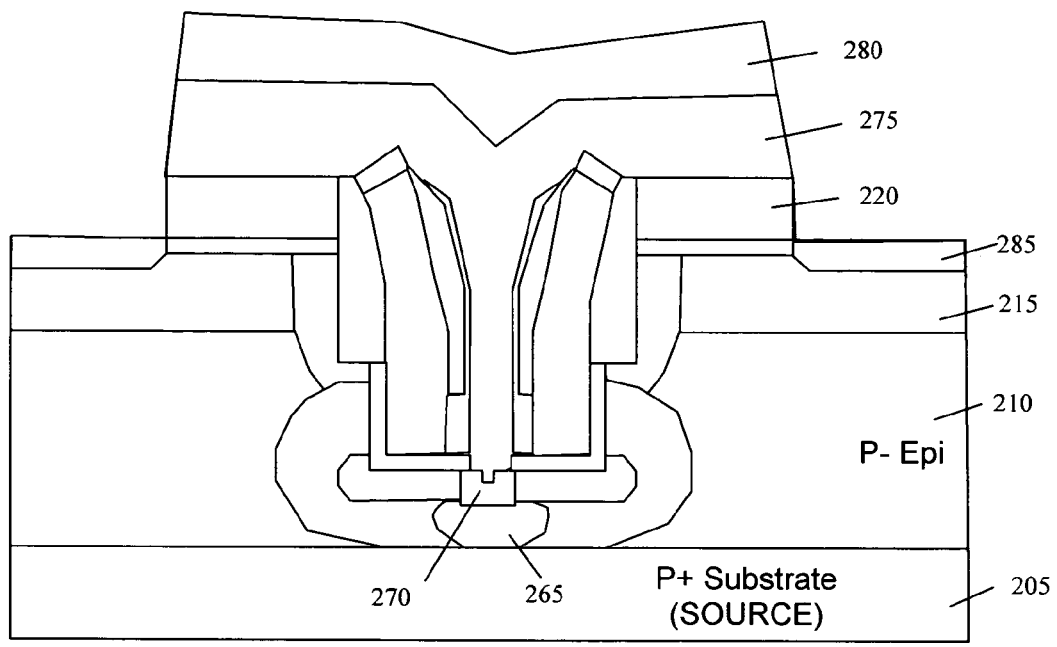
Figure 5T:
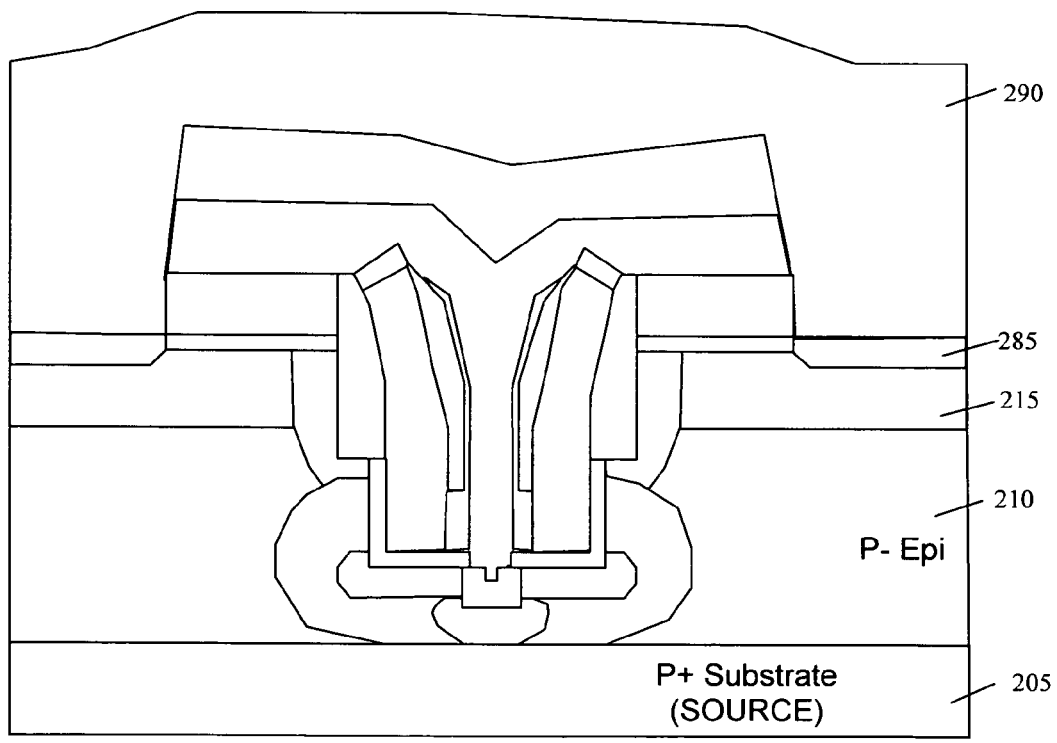

In FIG. 5O an anisotropic silicon etch is carried out to further etch the trench bottom with a etch depth ranging from 0.1 to 0.5 μm for a typical structure. Then a BF2 or boron blanket implant is performed to form a shallow contact region 265 immediately below the etched trench bottom followed by an implant annealing with a rapid thermal anneal (RTA) operation at 900 to 1100 C. for ten to sixty second with Nitrogen N2 gas. In FIG. 5P, a silicide deposition with Ti, Co, or W is performed followed by a RTA process. Then a salicide wet etch is carried out followed by a RTA process to form the salicided contact layer 270 at the bottom of the trench in immediate contact with the shallow contact regions 265. This process can optionally carried out by a tungsten deposition followed by etch back to form the tungsten plug as the body/source contact because the tungsten is compatible with the high temperature processing steps. Alternately, the formation of a WSix layer 270 is another option as a high temperature stable salicide layer without requiring the salicidation RTA processes by just tungsten deposition followed by etching back. In FIG. 5Q, an undoped thin oxide layer is deposited followed by a BPSG layer 275 deposition then a low temperature reflow compatible with the silicde structure 270 is performed at 850 to 900 C. In FIG. 5R, a passivation layer of PSG and SixNy or Si-rich nitride layer or oxynitride or silicon nitride layer 280 is deposited. In FIG. 5S, a drain and gate contact mask, i.e., a second mask (not shown), is applied. A nitride/oxide etch is performed to remove the passivation layer 280 and the oxide layers from the drain and gate contact areas. The process may proceed with an optional isotropic and anisotropic etch to develop sloped sidewalls. Then a shallow drain contact implant with N+ dopant of arsenic or phosphorous ions is carried out to form the N+ drain contact regions 285 followed by RTP annealing process with Nitrogen gas N2 at a temperature ranging between 900 to 1050 C. for less than one minute. In FIG. 5T, a thick metal layer 290 is deposited followed by etching and patterning the metal layer into gate and drain metal contacts by applying a metal mask as the third mask. Then an alloying process is performed to complete the fabrication processes.

According to above device configuration, a low manufacturing cost is achieved because a lower effective die cost can be achieved by using a small die and this reduced cost is able to offset the higher manufacturing costs. Most importantly, a low source inductance is achieved through the use of a substrate source contact while minimizing the source resistance by implementing the source-body short structure distributed over the device. Furthermore, a small pitch of the device as described above further reduces the specific-on-resistance (Rsp) for a given operating voltage. The device configuration is conveniently scalable for compatible designs and operations adaptable to devices that require a range of high and low voltages. The device further provides rugged and reliable performance with reduced possibility of latch up, reduced hot carrier injection, and capability to handle peak generation away from gate oxide, etc., because of the distributed body contact through the source-body short structure. Therefore, an inverted ground-source trenched FET device is disclosed that allows for vertical current through vertical channel. The controllable drift length of the drift region implemented with the vertical channel enable the manufactures of small and scalable cell pitch. With the source contact at the bottom of the trench in direct contact with the highly doped substrate reduces the source resistance. There is no longer a need for deep resistive sinker region or trench contact as that usually implemented in the conventional bottom source FET devices.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A method for manufacturing an iT-FET semiconductor device on a semiconductor substrate having a doped bottom layer functioning as a bottom source region, the method further comprising:
    opening a trench in the semiconductor substrate followed by doping a body region surrounding a lower portion of the sidewalls of the trench and below a bottom surface of the trench and doping a source region below the bottom surface of the trench encompassed in the body region;
    depositing a polysilicon layer into the trench followed by etching a central hole in the polysilicon layer in the trench for forming a trenched gate as the polysilicon layer attached to the trench sidewalls followed by doping a body contact region below the source region through the central hole wherein the trenched gate on the sidewalls controlling a vertical channel formed along said trenched gate in said body region for conducting a current vertically between a top drain electrode to the bottom source region.

2. The method of claim 1 further comprising:
    depositing into the central hole in the polysilicon layer in the trench with an insulation layer.

3. The method of claim 2 further comprising:
    etching a central portion of the insulation layer to expose a central portion of the bottom surface of the trench then etching a source-body contact hole through the source region through the exposed bottom surface of the trench before doping the body contact region below the source region.

4. The method of claim 3 further comprising:
    depositing a Ti, Co, or W followed by a rapid thermal anneal (RTA) and a salicide wet etch form a salicided contact layer in the source-body contact hole in immediate contact with the source region and the body contact region.

5. The method of claim 1 further comprising:
    doping a vertical linking region next to an upper portion of the trench sidewalls linking to and above the body region for linking to the channel region.

6. The method of claim 5 further comprising:
doping a top drift region above the vertical linking region and forming a drain contact region encompassed in the top drift region for contacting a top drain electrode above a top surface of the semiconductor substrate.

7. The method of claim 6 further comprising:
depositing insulation and passivation layer to top of the top surface of the semiconductor substrate on top of the drain contact region and the drift region and opening drain contact openings and gate openings.

8. The method of claim 7 further comprising:
depositing a metal layer on top of the insulation and passivation layers for contacting the drain contact region and gate contact regions following by patterning the metal layer into drain contact and gate contact pads.

9. The method of claim 1 wherein:
the step of opening the trench in the semiconductor substrate further comprising a step of first opening a shallow trench and covering the shallow trench with a conformal insulation layer followed by an anisotropic etch to form spacer layer on sidewalls of the shallow trench then etching through a bottom surface of the shallow trench using the spacer as a mask to form the trench for the trench gate of a greater depth into the semiconductor substrate.

10. The method of claim 9 further comprising a step of implanting a drift-link region before the formation of the spacer.

11. The method of claim 1 wherein:
the method of depositing a polysilicon layer into the trench followed by etching a central hole in the polysilicon layer in the trench further comprising a method of depositing a polysilicon layer followed by a depositing an oxide layer overlaying the polysilicon layer then followed by an anisotropic oxide etch and an anisotropic polysilicon etch.

12. The method of claim 1 further comprising:
manufacturing the iT-FET semiconductor device on the semiconductor substrate comprising an epitaxial layer lightly doped of a first conductivity overlaying a substrate layer heavily doped of the first conductivity.

13. The method of claim 12 further comprising:
blanket implanting a shallow drift layer on a top portion of the epitaxial layer.

14. The method of claim 1 further comprising:
manufacturing the iT-FET semiconductor device on the semiconductor substrate comprising an epitaxial layer lightly doped of a first conductivity overlaying a substrate layer heavily doped of a second conductivity opposite the first conductivity.

* * * * *